United States Patent
Zhong

(10) Patent No.: US 11,361,974 B2
(45) Date of Patent: Jun. 14, 2022

(54) METHOD FOR FORMING SEMICONDUCTOR STRUCTURE

(71) Applicant: UNITED MICROELECTRONICS CORP., Hsin-Chu (TW)

(72) Inventor: Weiwen Zhong, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 17/017,655

(22) Filed: Sep. 10, 2020

(65) Prior Publication Data
US 2022/0076964 A1    Mar. 10, 2022

(51) Int. Cl.
*H01L 21/32*    (2006.01)
*H01L 21/321*    (2006.01)
*H01L 21/768*    (2006.01)

(52) U.S. Cl.
CPC ...... *H01L 21/3212* (2013.01); *H01L 21/7684* (2013.01)

(58) Field of Classification Search
CPC .......... H01L 21/3212; H01L 21/7684
USPC ................................. 438/690–693
See application file for complete search history.

(56) References Cited

U.S. PATENT DOCUMENTS

| 6,403,464 B1* | 6/2002 | Chang ............... H01L 21/02282 438/623 |
| 8,445,382 B2 | 5/2013 | Besling |
| 8,889,544 B2 | 11/2014 | Wu |
| 2014/0004717 A1* | 1/2014 | Chan ................. H01L 21/76825 438/798 |

OTHER PUBLICATIONS

Translation of CN104658967A (Year: 2015).*

* cited by examiner

*Primary Examiner* — Duy Vu N Deo
(74) *Attorney, Agent, or Firm* — Winston Hsu

(57) ABSTRACT

A method for forming a semiconductor structure includes the steps of providing a substrate having a first region and a second region, forming a plurality of semiconductor devices on the first region of the substrate, forming a planarization layer on the substrate and covering the semiconductor devices, wherein the planarization layer on the first region and the planarization layer on the second region have a step-height, performing a first CMP process to remove the step height of the planarization layer, and after the first CMP process, performing a curing process to convert the planarization layer into a porous low-k dielectric layer.

10 Claims, 4 Drawing Sheets

METHOD FOR FORMING SEMICONDUCTOR STRUCTURE

BACKGROUND OF THE INVENTION

1. Field of the Invention

The present invention generally relates to a method for forming a semiconductor structure. More particularly, the present invention relates to a method for planarizing a porous low-k dielectric layer having a step-height.

2. Description of the Prior Art

As the features of integrated circuits (IC) devices are reduced to smaller sizes, capacitive effects such as coupling (crosstalk) and propagation delay has become more obvious. Various low-k dielectric materials have been developed and used in integrated circuit to reduce capacitive effects. How to successfully integrate low-k dielectric material into the integrated circuit structures is important in the field.

SUMMARY OF THE INVENTION

One objective of the present invention is to provide a method for planarizing a porous low-k dielectric layer having a step-height, in which a precursor film (the planarization layer) of the porous low-k dielectric layer is subjected to a CMP process to remove the step-height and then being cured and converted into the porous low-k dielectric layer. In this way, a better planarization result may be obtained.

According one embodiment of the present invention, a method for forming a semiconductor structure includes providing a substrate having a first region and a second region, forming a plurality of semiconductor devices on the first region of the substrate, forming a planarization layer on the substrate and covering the semiconductor devices, wherein the planarization layer on the first region and the planarization layer on the second region have a step-height, performing a first CMP process to remove the step height of the planarization layer, and after the first CMP process, performing a curing process to convert the planarization layer into a porous low-k dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The above and other aspects and features of the present invention will become apparent by describing in detail exemplary embodiments thereof with reference to the attached drawings. Various structures shown in the drawings are not necessarily drawn to scale, and structural, logical, and electrical changes may be made in other embodiments without departing from the scope of the present invention.

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

It will be understood that when an element or layer is referred to as being "on" or "connected to" another element or layer, it may be directly on or directly connected to the other element or layer, or intervening elements or layers may be presented. In contrast, when an element is referred to as being "directly on" or "directly connected to" another element or layer, there are no intervening elements or layers presented.

The terms "wafer" and "substrate" used herein include any structure having an exposed surface onto which a layer is deposited according to the present invention, for example, to form the circuit structure. The term substrate is understood to include semiconductor wafers, but not limited thereto. The term substrate is also used to refer to semiconductor structures during processing, and may include other layers that have been fabricated thereupon.

Porous low-k dielectric materials are widely used as the inter-metal dielectric layer of the integrated circuits. Semiconductor devices integrally formed in the inter-metal dielectric layer may cause obvious step-height of the porous low-k dielectric layer. However, the cured porous low-k dielectric layer may have non-uniform hardness that may cause difficulty to the planarization process. The method provide by the present invention may overcome the difficulty and provides a planar surface for subsequent manufacturing process.

Figure 1:
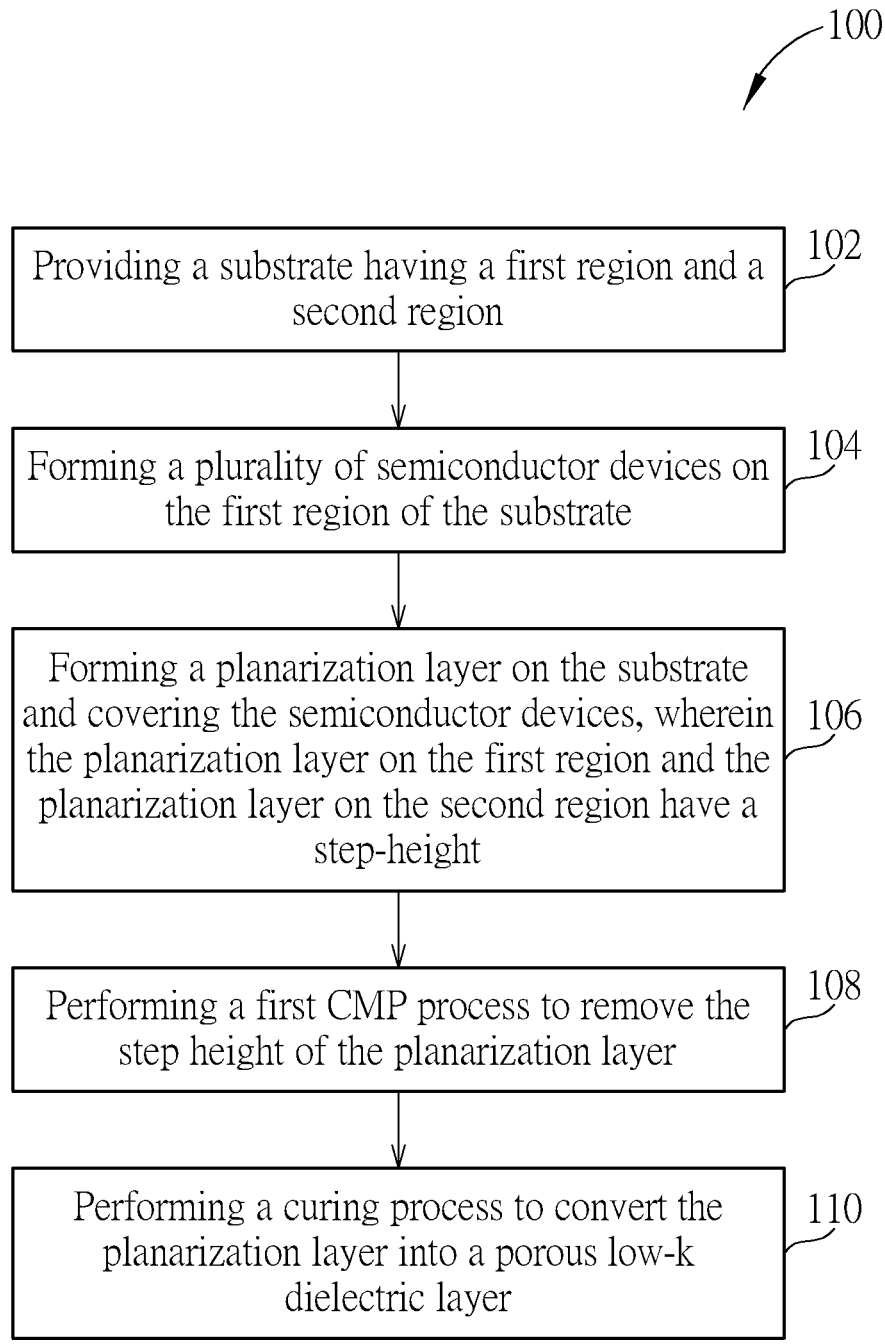
FIG. 1 illustrates a flow diagram of a method for forming a semiconductor structure according to an embodiment of the present invention.

FIG. 1 illustrates a flow diagram of a method for forming a semiconductor structure according to an embodiment of the present invention. FIG. 2 to FIG. 7 are schematic cross-sectional views illustrating the steps of forming a semiconductor structure according to an embodiment of the present invention.

Please refer to FIG. 1. The method 100 for forming a semiconductor structure includes step 102, which includes providing a substrate having a first region and a second region.

Figure 2:
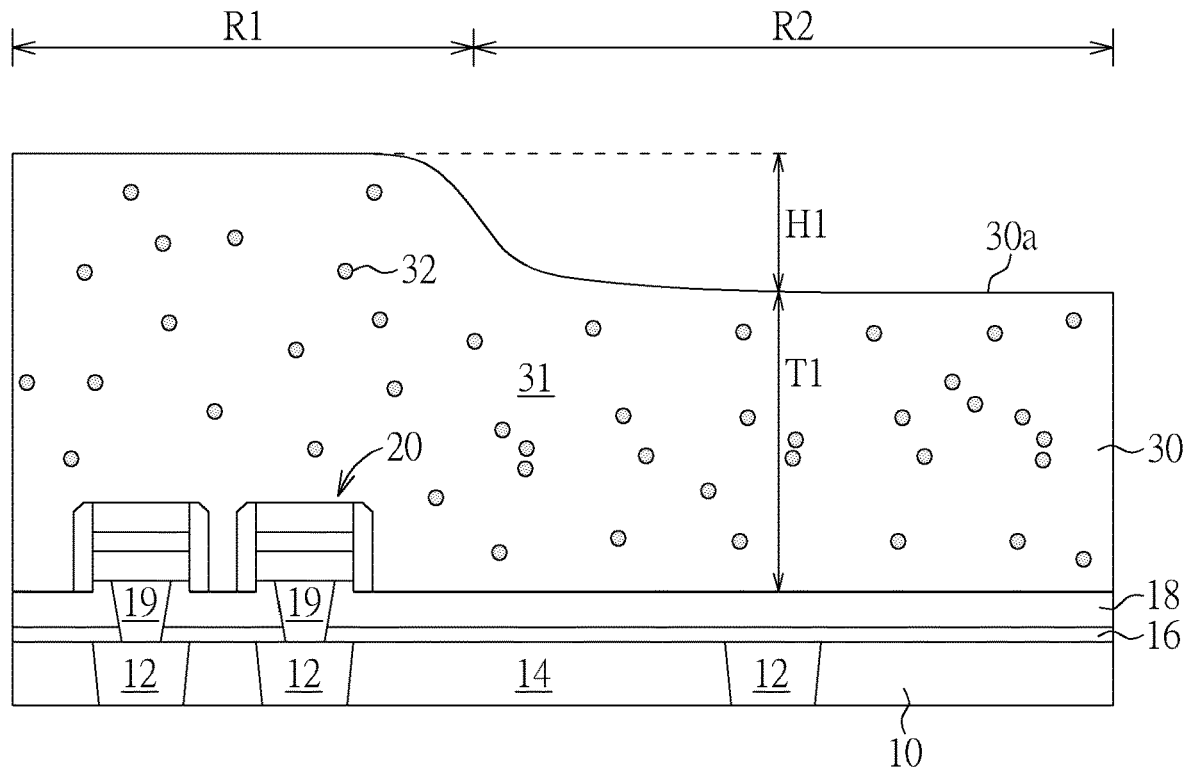
FIG. 2 to FIG. 7 are schematic cross-sectional views illustrating the steps of forming a semiconductor structure according to an embodiment of the present invention.

As shown in FIG. 2, a substrate 10 having a first region R1 and a second region R2 is provided. The substrate 10 may be a semi-manufactured semiconductor structure. For example, the substrate 10 may have finished the front-end-online (FEOL) processes and may include, for example, isolations structures, transistors and contacts formed therein. The substrate 10 may also have finished a portion of the back-end-online (BEOL) process and may include at least a metal-interconnect layer formed therein. For the sake of simplicity, only one dielectric layer 14 and the interconnect structures 12 formed in the dielectric layer 14 are shown in FIG. 2.

The interconnect structures 12 may include metals, such as cobalt (Co), copper (Cu), aluminum (Al), tungsten (W), nickel (Ni), platinum (Pt), tantalum (Ta) or titanium (Ti), but not limited thereto. The interconnect structures 12 may further include a metal diffusion barrier layer(not shown), and the metal diffusion barrier layer may include titanium (Ti), titanium nitride (TiN), tantalum (Ta), tantalum nitride (TaN), or tungsten nitride (WNx), but not limited thereto. The dielectric layer 14 may include dielectric materials, such as silicon oxide (SiO2), un-doped silicon glass (USG), fluorine-doped silicon glass (FSG) or other suitable low-k dielectric materials, but not limited thereto.

The first region R1 and the second region R2 of the substrate 10 are defined according to the pattern density appearing to be covered by the planarization layer 30. In some embodiments, the first region R1 may be a densepattern region, and the second region R2 may be an iso-pattern region. In some embodiments, the first region R1 may be a memory region that has embedded memory arrays formed thereon and covered by the planarization layer 30, and the second region R2 may be an interconnect region that is substantially a spacious region covered by the planarization layer 30.

A barrier layer 16 and another dielectric layer 18 may be successively formed on the substrate 110. A plurality of bottom vias 19 may be formed in the dielectric layer 18 and the barrier layer 16 and are electrically connected to the interconnect structures 12 in the first region R1 of the substrate 10. In some embodiments, the barrier layer 16 may include silicon nitride (SiN), silicon oxynitride (SiON), silicon carbide (SiC), nitride doped silicon carbide (NDC), or oxygen doped silicon carbide (ODC), but not limited thereto. The dielectric layer 18 may include dielectric materials such as silicon oxide (SiO2), un-doped silicon glass (USG), fluorine-doped silicon glass (FSG) or other applicable low-k dielectric materials, but not limited thereto. The bottom vias 19 may include metal such as cobalt (Co), copper (Cu), aluminum (Al), tungsten (W), nickel (Ni), platinum (Pt), tantalum (Ta) or titanium (Ti), but not limited thereto. The bottom vias 19 may further include a metal diffusion barrier layer (not shown), and the metal diffusion barrier layer may include titanium (Ti), titanium nitride (TiN), tantalum (Ta), tantalum nitride (TaN), or tungsten nitride (WNx), but not limited thereto.

Subsequently, step 104 is performed, which includes forming a plurality of semiconductor devices on the first region of the substrate.

As shown in FIG. 2, a plurality of semiconductor devices 20 are formed on the dielectric layer 18 on the first region R1 of the substrate 10 and respectively disposed on one of the bottom vias 19. In some embodiments, the semiconductor devices 20 may include memory devices, such as magnetoresistive random-access memory (MRAM), ferroelectric random access memory (FeRAM) or resistive random access memory (ReRAM), but not limited thereto.

Subsequently, step 106 is performed, which includes forming a planarization layer on the substrate and covering the semiconductor devices, wherein the planarization layer on the first region and the planarization layer on the second region have a step-height.

As shown in FIG. 2, a planarization layer 30 is formed on the substrate 10 in a blanket manner and completely covers the semiconductor devices 20. The planarization layer 30 may include a mixture of a dielectric material 31 and porogens 32 (pore-forming agents) that are interspersed in the dielectric material 31. The planarization layer 30 may be converted into a porous low-k dielectric layer 40 (see FIG. 4) after being cured at an appropriate temperature. In other words, the planarization layer 30 is a precursor film of the porous low-k dielectric layer 40. In some embodiments, the dielectric material 31 of the planarization layer 30 may include silica-based materials, but not limited thereto. The porogens 32 may include thermal labile or ultraviolet labile hydrocarbon ($C_xH_y$) compounds, but not limited thereto.

Due to the presence of the semiconductor devices 20, the planarization layer 30 may have a non-planar surface 30a having at least a depressed region corresponding to the second region R2 of the substrate 10 and at least an elevated region corresponding to the first region R1 of the substrate 10. As shown in FIG. 2, the planarization layer 30 on the second region R2 of the substrate 10 may have a first thickness T1, and the planarization layer 30 on the first region R1 and the planarization layer 30 on the second region R2 may have a step-height H1. According to an embodiment, the first thickness T1 may range between 4000 Å and 5000 Å. Depending on the height of the semiconductor devices 20 and the step coverage ability of the planarization layer 30, the step-height H1 may still be more than 1500 Å.

Subsequently, step 108 is performed, which includes performing a first CMP process to remove the step height of the planarization layer.

Figure 3:
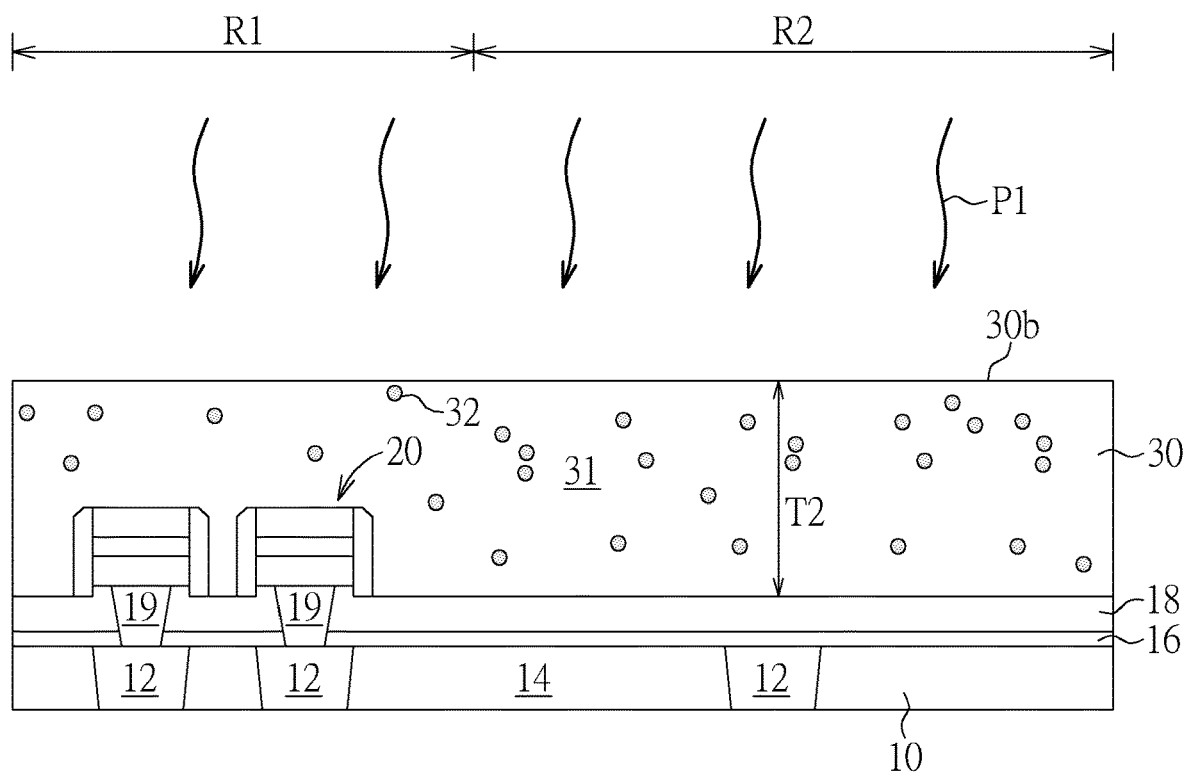

As shown in FIG. 3, a first chemical mechanical polishing (CMP) process P1 is performed on the surface 30a of the planarization layer 30 to remove a portion of the planarization layer 30 until a substantially planar surface 30b of the planarization layer 30 is obtained. After the first CMP process P1, the planarization layer 30 on the second region R2 of the substrate 10 may have a second thickness T2. According to an embodiment, the second thickness T2 may range between 2900 Å and 3100 Å.

Subsequently, step 110 is performed, which includes performing a curing process to convert the planarization layer into a porous low-k dielectric layer.

Figure 4:
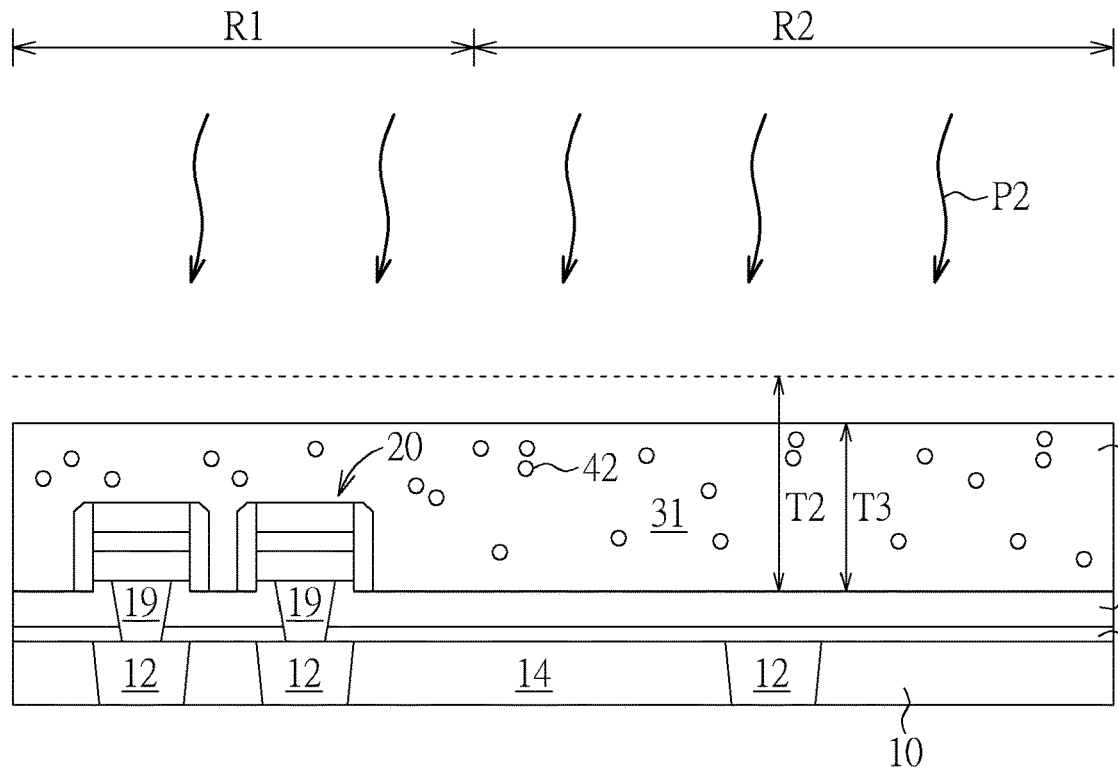

As shown in FIG. 4, after the first CMP process P1, a curing process P2 is performed to convert the planarization layer 30 into a porous low-k dielectric layer 40. The curing process P2 may include one or both of a thermal treatment or an ultraviolet radiation treatment. In some embodiments, the curing process P2 may be conducted at a temperature ranging between 300° C. and 500° C., and preferably between 300° C. and 400° C. In some embodiments, the curing process P2 may include an exposure to radiation of a wavelength from 10 nm to 400 nm. In some embodiments, the processing time of the curing process P2 may be about 30 seconds to about 600 seconds.

During the curing process P2, at least some of the porogens 32 interspersed in the dielectric material 31 may be decomposed into gaseous compounds and evacuate from the dielectric material 31, such that a plurality of pores 42 are left behind in the dielectric material 31 to form the porous low-k dielectric layer 40. In other words, by performing the curing process P2, the porogens 32 are converted into pores 42 of the porous low-k dielectric layer 40. According to an embodiment, an average dielectric constant of the porous low-k dielectric layer 40 is smaller than 3.

In some embodiments, during the curing process P2, at least a portion of the dielectric material 31 may undergo a restructuring and results in shrinkage of the thickness. After the curing process P2, the porous low-k dielectric layer 40 on the second region R2 of the substrate 10 may have a third thickness T3. In some embodiments, the third thickness T3 may range between 2600 Å and 2800 Å.

In some embodiments, the curing process P2 may impart a mechanical strength to the resultant porous low-k dielectric layer 40. That is, the hardness of the porous low-k dielectric layer 40 may be higher than the hardness of the planarization layer 30.

In some embodiments, some of the porogens 32 in a deeper region of the planarization layer 30 may not be decomposed, and therefore remain in the porous low-k dielectric layer 40. In some embodiments, the portion of the dielectric material 31 near the surface 30b and the portion of the dielectric material 31 farther from the surface 30b may undergo different degrees of restructuring, and therefore the resultant porous low-k dielectric layer 40 may have different hardness through its thickness.

One feature of the present invention is that, in a situation that an obvious step-height occurs in the precursor film of the porous low-k dielectric layer, the precursor film is subjected to a CMP process to remove the step-height before being cured and converted into the porous low-k dielectric layer. In this way, the CMP process may obtain a better planarization result without being influenced by non-uniform hardness of the cured porous low-k dielectric layer.

Figure 5:
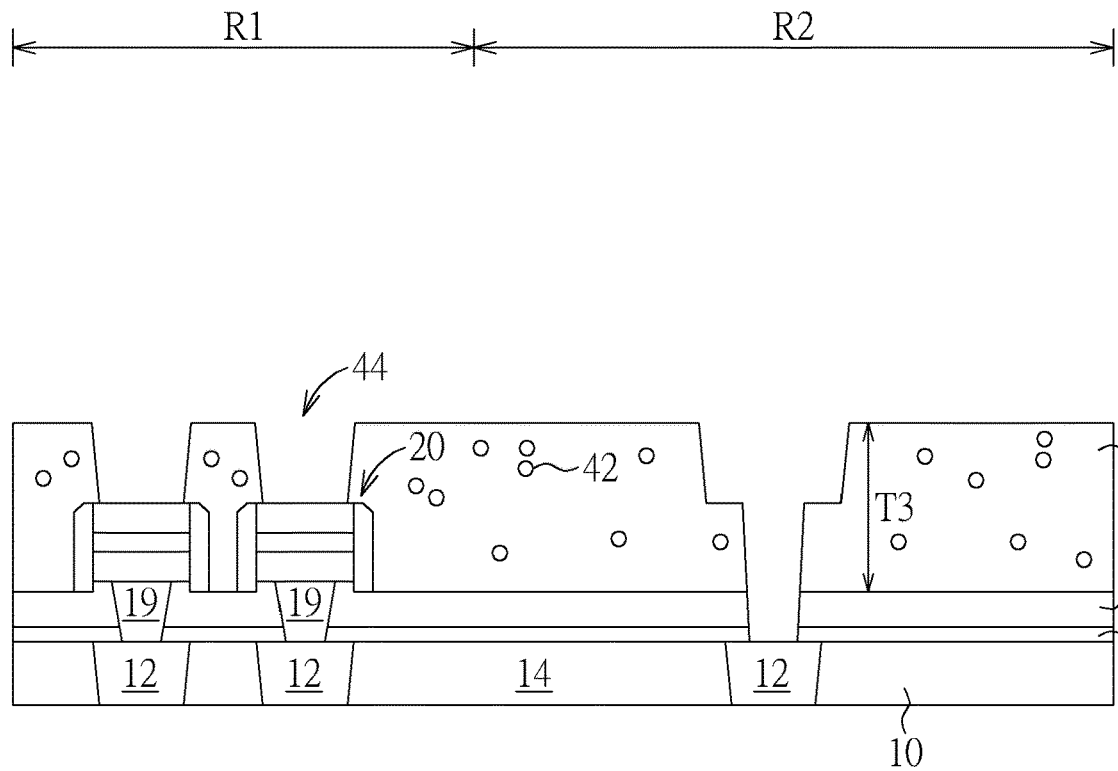

After the curing process P2, subsequent process steps for forming the semiconductor structure may be performed. Please refer to FIG. 5. A patterning process may be performed to define a plurality of openings 44 in the porous low-k dielectric layer 40 on the first region R1 and the second region R2 of the substrate 10. The patterning process may include one or multiple photolithography-etching processes. As shown in FIG. 5, the openings 44 in the porous low-k dielectric layer 40 on the first region R1 may extend through a portion of the porous low-k dielectric layer 40 and are respectively aligned with one of the semiconductor devices 20 and expose portions of the semiconductor devices 20. The opening 44 in the porous low-k dielectric layer 40 on the second region R2 may extend through the porous low-k dielectric layer 40, the dielectric layer 18 and the barrier layer 16 to exposes a portion of the interconnect structure 12 in the second region R2 of the substrate 10.

Figure 6:
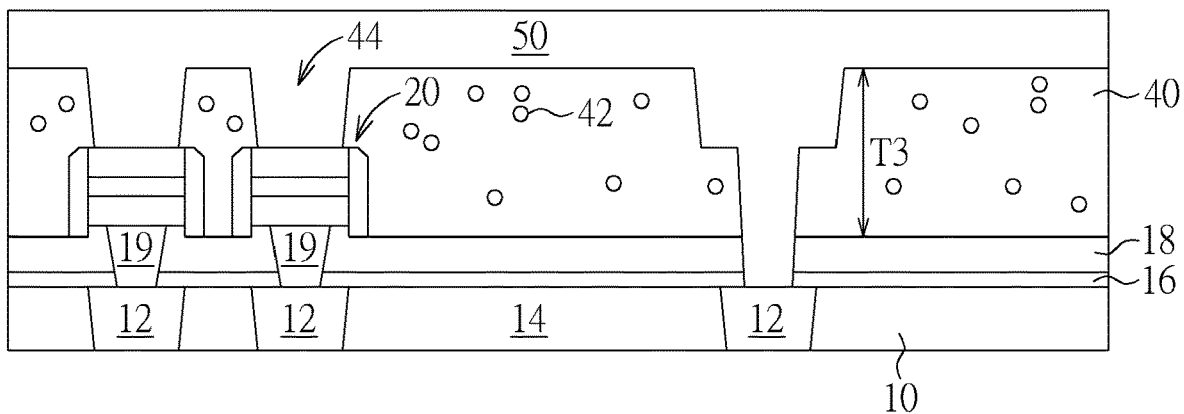

Please refer to FIG. 6. Subsequently, a conductive layer 50 is formed on the porous low-k dielectric layer 40 in a blanket manner and fills the opening 44. The conductive layer 50 may include metals such as cobalt (Co), copper (Cu), aluminum (Al), tungsten (W), nickel (Ni), platinum (Pt), tantalum (Ta) or titanium (Ti), but not limited thereto. According to an embodiment, the conductive layer 50 includes copper. In some embodiment, a barrier layer (not shown) may be formed on the porous low-k dielectric layer 40 before forming the conductive layer 50. The barrier layer may include titanium (Ti), titanium nitride (TiN), tantalum (Ta), tantalum nitride (TaN), or tungsten nitride (WNx), but not limited thereto.

Figure 7:
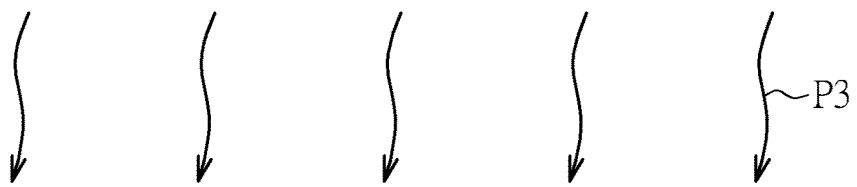
Figure 7:
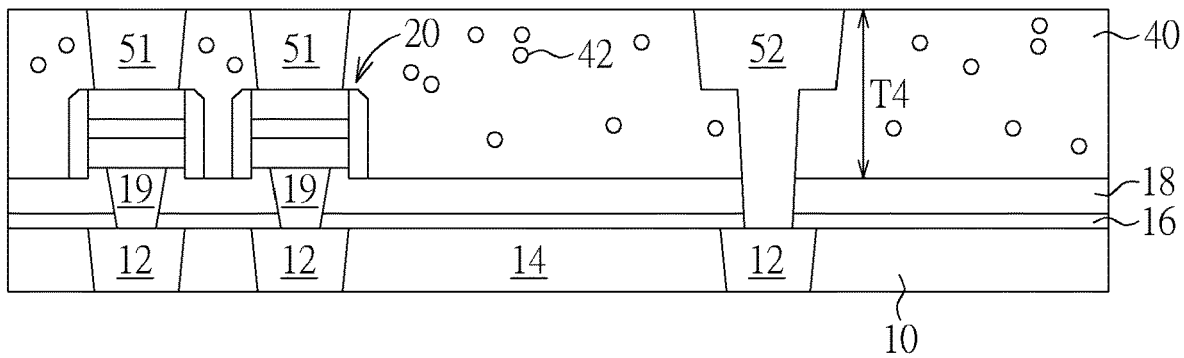

Please refer to FIG. 7. Subsequently, a second chemical mechanical polishing (CMP) process P3 is performed to remove the conductive layer 50 outside the openings 44, thereby forming the top vias 51 electrically connected to the semiconductor devices 20 on the first region R1 of the substrate 10 and the interconnect structure 52 electrically connected to the interconnect structure 12 in the second region R2 of the substrate 10. It is noteworthy that a portion of the porous low-k dielectric layer 40 may also be removed during the second CMP process P3. After the second CMP process P3, the porous low-k dielectric layer 40 on the second region R2 of the substrate 10 may have a fourth thickness T4. In some embodiments, the fourth thickness T4 may range between 2500 Å and 2700 Å.

In conclusion, the present invention provides a method to form a planarized porous low-k dielectric layer, in which a precursor film of the porous low-k dielectric layer is subjected to a CMP process (the first CMP process) before being converted into the cured porous low-k dielectric layer. In other words, the CMP process (the first CMP process) for planarization of the porous low-k dielectric layer is performed on a non-cured precursor film of the porous low-k dielectric layer. In this way, the CMP process may obtain a better planarization result without being influenced by non-uniform hardness of the cured porous low-k dielectric layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
   providing a substrate having a first region and a second region;
   forming a plurality of semiconductor devices on the first region of the substrate;
   forming a planarization layer on the substrate and covering top surfaces and sidewalls of the semiconductor devices, wherein the planarization layer on the first region and the planarization layer on the second region have a step-height;
   performing a first CMP process to remove the step height of the planarization layer, wherein the semiconductor devices are completely covered by the planarization layer after the first CMP process; and
   after the first CMP process, performing a curing process to convert the planarization layer into a porous low-k dielectric layer.

2. The method according to claim 1, wherein a dielectric constant of the porous low-k dielectric layer is smaller than 3.

3. The method according to claim 1, wherein the curing process is at a temperature between 300° C. and 400° C.

4. The method according to claim 1, wherein the planarization layer comprises a plurality of porogens, and the porogens are converted into pores of the porous low-k dielectric layer by the curing process.

5. The method according to claim 1, wherein the step-height is more than 1500 Å.

6. The method according to claim 1, wherein the planarization layer on the second region of the substrate has a first thickness before the first CMP process and a second thickness after the first CMP process, and the porous low-k dielectric layer on the second region of the substrate has a third thickness, wherein first thickness is between 4000 Å and 5000 Å, the second thickness is between 2900 Å and 3100 Å, the third thickness is between 2600 Å and 2800 Å.

7. The method according to claim 1, wherein the semiconductor devices comprise MRAM, FeRAM or ReRAM.

8. The method according to claim 1, further comprising:
   forming a barrier layer and a dielectric layer on the substrate before forming the semiconductor devices; and
   forming a plurality of bottom vias in the barrier layer and the dielectric layer, wherein the semiconductor devices are respectively disposed on one of the bottom vias.

9. The method according to claim 1, further comprising:
   forming a plurality of openings in the porous low-k dielectric layer on the semiconductor devices after the curing process;
   forming a conductive layer on the porous low-k dielectric layer and filling the openings; and
   performing a second CMP process to remove the conductive layer outside the openings.

10. The method according to claim 6, wherein the conductive layer comprises copper.

* * * * *